(12) United States Patent
Wang et al.

(10) Patent No.: US 10,818,659 B2
(45) Date of Patent: Oct. 27, 2020

(54) FINFET HAVING UPPER SPACERS ADJACENT GATE AND SOURCE/DRAIN CONTACTS

(71) Applicant: GLOBALFOUNDRIES INC., Grand Cayman (KY)

(72) Inventors: Haiting Wang, Clifton Park, NY (US); Hui Zang, Guilderland, NY (US); Guowei Xu, Ballston Lake, NY (US); Scott Beasor, Greenwich, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 36 days.

(21) Appl. No.: 16/161,294

(22) Filed: Oct. 16, 2018

(65) Prior Publication Data
US 2020/0119000 A1 Apr. 16, 2020

(51) Int. Cl.
| H01L 27/088 | (2006.01) |
| H01L 21/8234 | (2006.01) |
| H01L 29/78 | (2006.01) |
| H01L 29/66 | (2006.01) |
| H01L 29/417 | (2006.01) |

(52) U.S. Cl.
CPC .. *H01L 27/0886* (2013.01); *H01L 21/823418* (2013.01); *H01L 21/823431* (2013.01); *H01L 21/823468* (2013.01); *H01L 21/823475* (2013.01); *H01L 29/41775* (2013.01); *H01L 29/41791* (2013.01); *H01L 29/6656* (2013.01); *H01L 29/66545* (2013.01); *H01L 29/7851* (2013.01); *H01L 2029/7858* (2013.01)

(58) Field of Classification Search
CPC .......... H01L 27/0886; H01L 29/41775; H01L 29/6656; H01L 21/823475; H01L 21/823418
See application file for complete search history.

(56) References Cited

U.S. PATENT DOCUMENTS

| 5,256,274 A | 10/1993 | Poris |
| 5,270,554 A | 12/1993 | Palmour |
| 5,368,711 A | 11/1994 | Poris |
| 6,087,235 A | 7/2000 | Yu |
| 6,184,129 B1 | 2/2001 | Hwang et al. |
| 6,210,991 B1 | 4/2001 | Wenham et al. |
| 6,686,616 B1 | 2/2004 | Allen et al. |
| 8,362,542 B2 | 1/2013 | Kang et al. |
| 8,742,510 B2 | 6/2014 | Baars et al. |
| 9,899,515 B1 * | 2/2018 | Cheng .................. H01L 27/088 |
| 10,049,943 B2 * | 8/2018 | Yeo .................. H01L 21/26513 |

(Continued)

*Primary Examiner* — Kyoung Lee
*Assistant Examiner* — Christina A Sylvia
(74) *Attorney, Agent, or Firm* — Gibb & Riley, LLC

(57) ABSTRACT

Processes form integrated circuit apparatuses that include parallel fins, wherein the fins are patterned in a first direction, and parallel gate structures intersect the fins in a second direction perpendicular to the first direction. Also, source/drain structures are positioned on the fins between the gate structures, source/drain contacts are positioned on the source/drain structures, sidewall insulators are positioned between the gate structures and the source/drain contacts (wherein the sidewall insulators have a lower portion adjacent to the fins and an upper portion distal to the fins), and upper sidewall spacers are positioned between the upper portion of the sidewall insulators and the source/drain contacts.

20 Claims, 13 Drawing Sheets

(56) References Cited

U.S. PATENT DOCUMENTS

| | | | | |
|---|---|---|---|---|
| 2006/0183327 A1* | 8/2006 | Moon | ............... | H01L 21/76843 438/687 |
| 2006/0292716 A1 | 12/2006 | Gu et al. | | |
| 2013/0277680 A1 | 10/2013 | Green et al. | | |
| 2015/0255571 A1* | 9/2015 | Xu | ................... | H01L 29/66545 257/288 |

\* cited by examiner

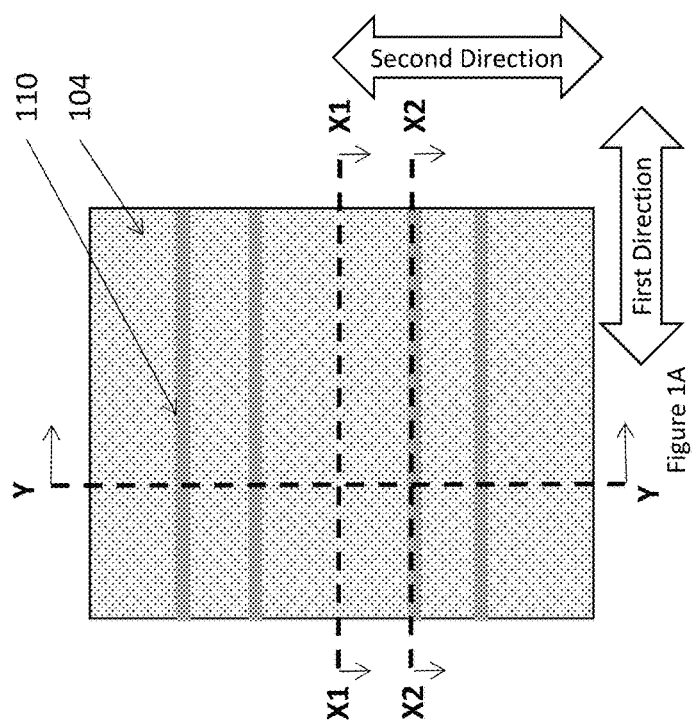
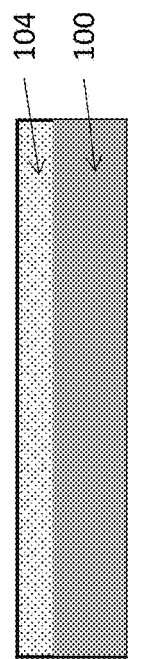
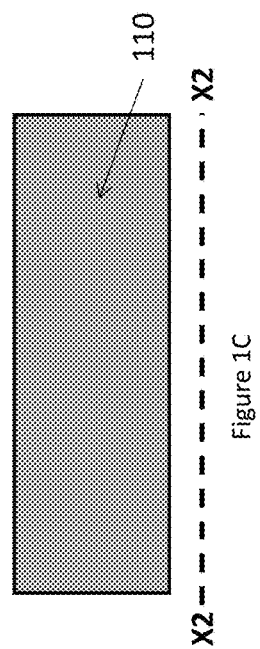
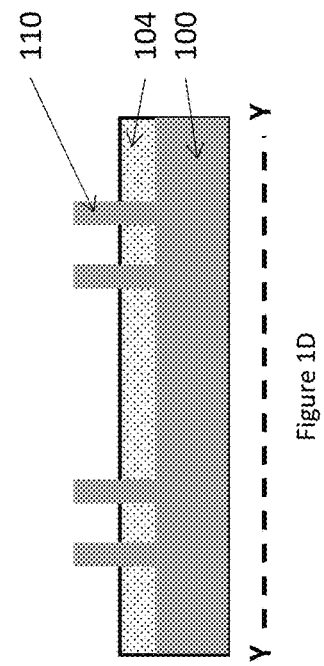

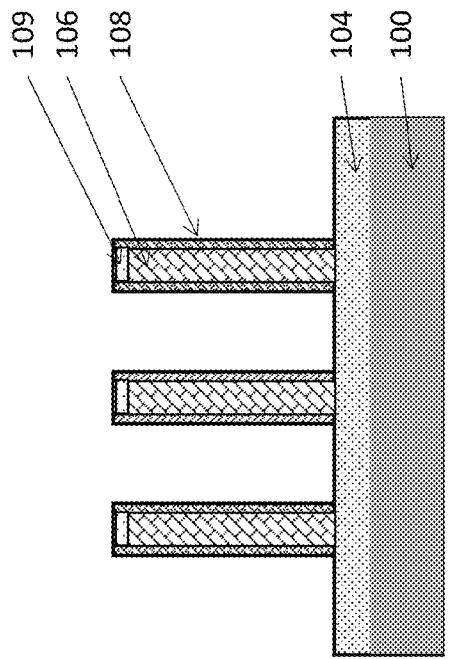
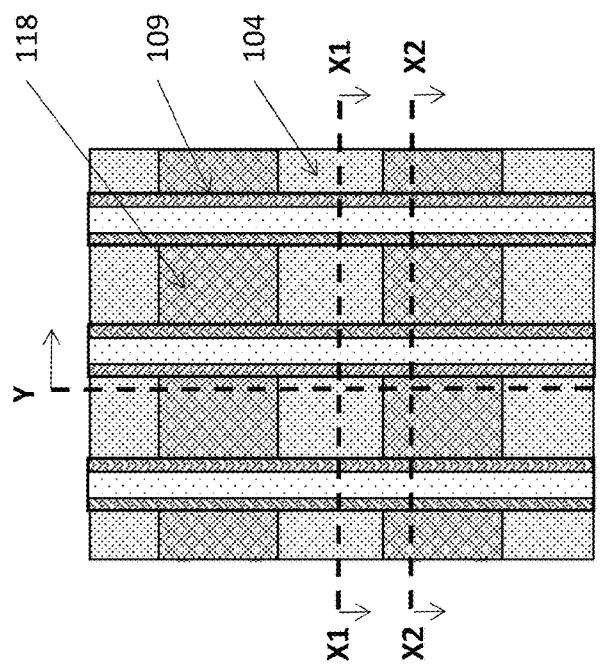
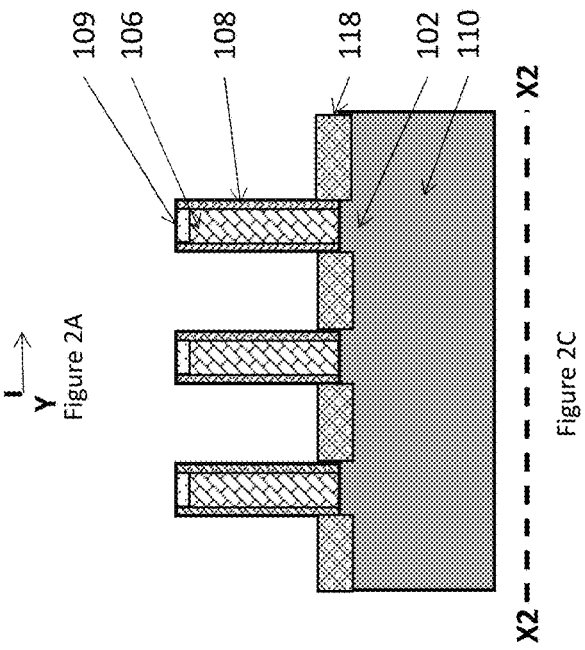
Figure 2A
Figure 2B
Figure 2C
Figure 2D

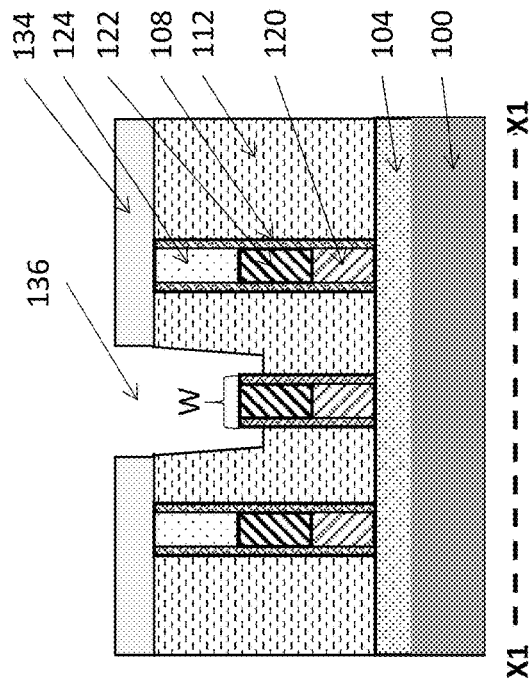
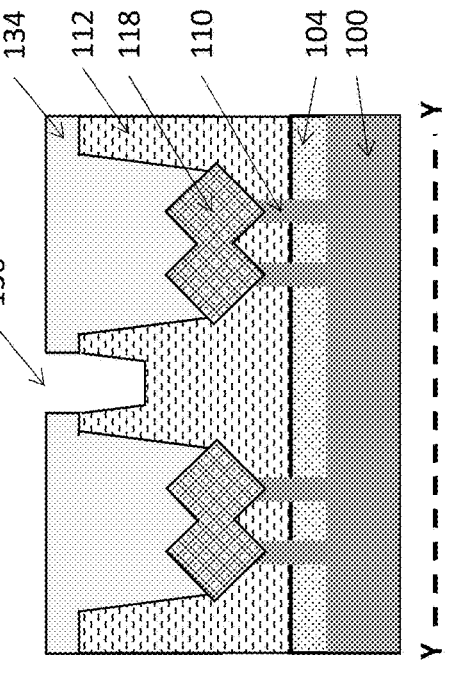
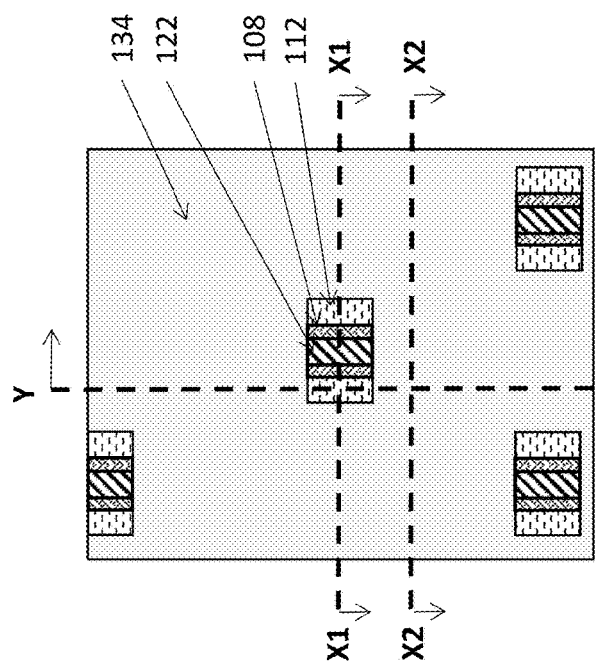
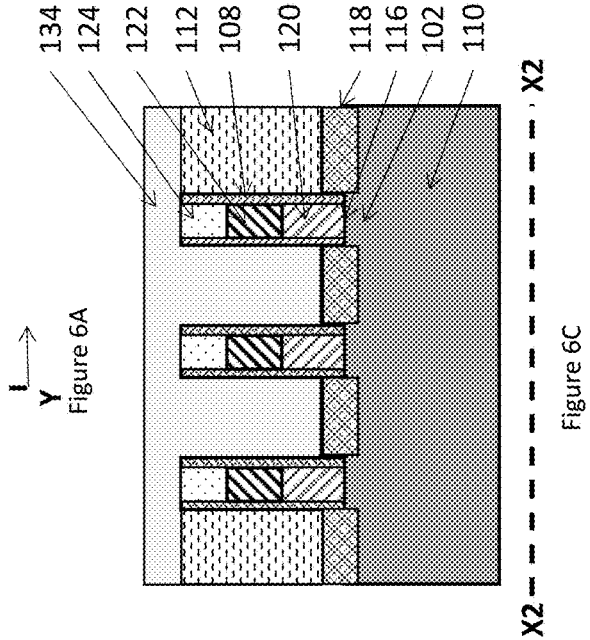
Figure 6A
Figure 6B
Figure 6C
Figure 6D

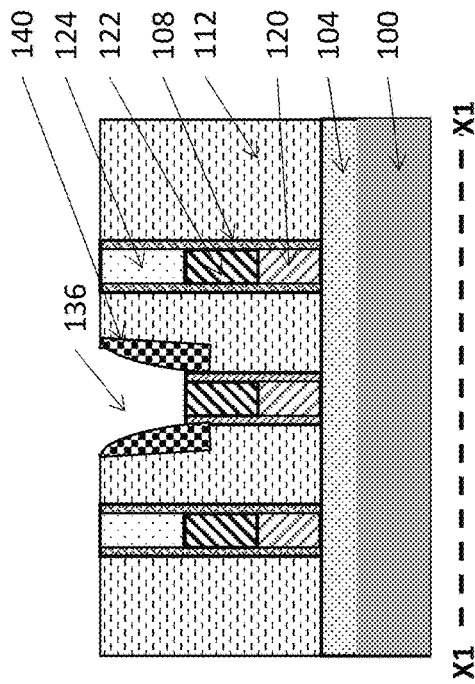
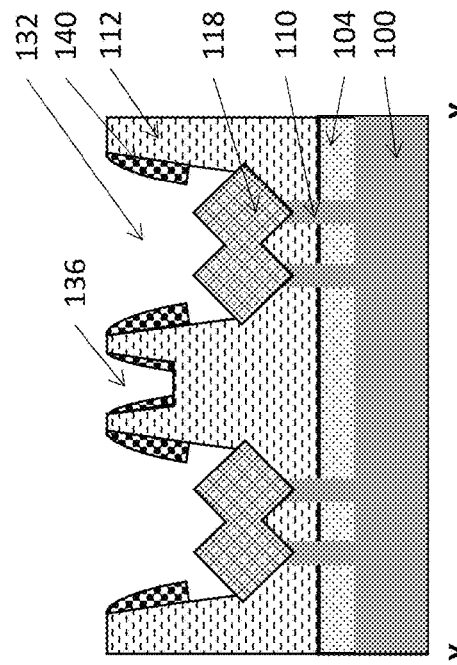
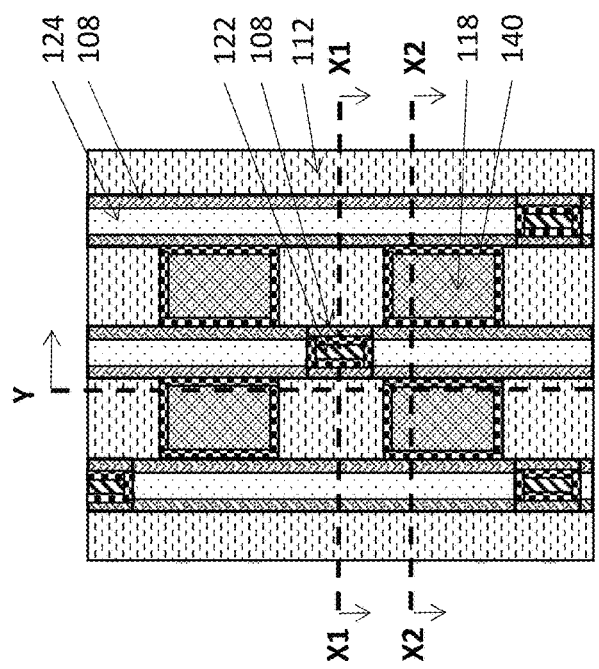
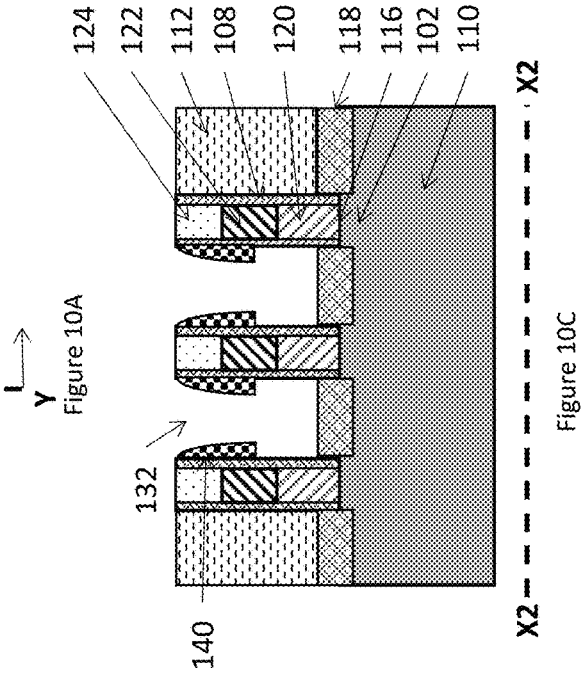

FINFET HAVING UPPER SPACERS ADJACENT GATE AND SOURCE/DRAIN CONTACTS

BACKGROUND

Field of the Invention

The present disclosure relates to integrated circuit devices and to processing for making such devices, and more specifically to processing that accommodates contact misalignment by providing additional upper spacers adjacent gate and source/drain contacts.

Description of Related Art

Integrated circuit devices use transistors for many different functions, and these transistors can take many different forms, from planar transistors, to transistors that use a "fin" style structure (e.g., fin-type field effect (FinFET) transistors). A fin of a fin-type transistor is a thin, long, six-sided shape (that is somewhat rectangular) that extends from, or has a bottom surface that is part of, a substrate; with sides that are longer than they are wide, a top and bottom that have somewhat similar lengths as the sides (but that have widths that are much narrower) and ends that are approximately as tall from the substrate as the width of the sides, but that are only approximately as wide as the top and/or bottom. Rounding and uneven shaping can occur (especially at the corners and top) in such fin structures, and often such structures have a rounded, tapered shape; however, such structures are highly distinguishable from planar devices (even though both types of devices are highly useful).

In one example, conventional processing forms source/drains on fins between intersecting gates. Sometimes the insulator between the gates and the source/drain contacts can be reduced or removed, allowing shorts (undesirable electrical connections) between the gates and the source/drain contacts to be formed. In addition, when forming upper contacts through overlying inter-layer dielectrics (ILDs) to the gates and the source/drain contacts it can be difficult to properly align such contacts, which may also result in unintended/undesirable short circuits.

SUMMARY

Exemplary methods herein pattern a layer to form parallel fins extending from the layer, where the fins are patterned in a first direction. These methods also pattern parallel sacrificial gates intersecting the fins in a second direction perpendicular to the first direction, and form sidewall insulators on sidewalls of sacrificial gates. Additionally, such methods epitaxially grow source/drain structures on fins between the sacrificial gates and form a dielectric layer on the source/drain structures. These methods replace the sacrificial gates with a first conductor and caps on the first conductor.

In such processing, the methods herein pattern the dielectric layer to expose the source/drain structures and the sidewall insulators, and this forms source/drain contact recesses. Additionally, such methods remove selected ones of the caps to expose the first conductor and this forms gate contact recesses. This process of removing selected ones of the caps recesses the dielectric layer below the top of the first conductor to cause a portion of the first conductor and the sidewall insulators to protrude and extend above the bottom of the gate contact recess (in this disclosure the "top" of structures is more distal to the fins, while the "bottom" is relatively adjacent to the fins).

These methods form a sacrificial layer in the source/drain contact recesses and in the gate contact recesses and then reduce the height of the sacrificial layer (to a "first" height from the fins) in processing that leaves the upper portion of the sidewall insulators exposed and that removes all the sacrificial layer from the gate contact recesses. With the reduced-height sacrificial layer in place, these methods form upper sidewall spacers on the sidewall surfaces not covered by the reduced-height sacrificial layer. This forms the upper sidewall spacers on the upper portion of the sidewall insulators and on the sidewalls of the gate contact recesses in the same processing operation. The upper sidewall spacers can be a different insulator material from the sidewall insulators (e.g., the two can have different dielectric constants). The remaining portions of the sacrificial layer are then removed, and a second conductor is formed in the gate contact recesses and the source/drain contact recesses, which forms contacts through the dielectric layer to the first conductor and the source/drain structures (in a single processing step).

Various exemplary integrated circuit apparatuses herein include (among other components) parallel fins, extending from a lower layer, that are patterned in a first direction, and parallel gate structures intersecting the fins in a second direction perpendicular to the first direction. Additionally, a gate insulator is between the bottom of the gate structures and the fins. A lower gate contact is positioned on the top of the gate structures, epitaxial source/drain structures are positioned on the fins between the gate structures, and lower source/drain contacts are on the source/drain structures between the gate structures.

Sidewall insulators are positioned between the gate structures and the lower source/drain contacts. The sidewall insulators have a lower portion adjacent to the fins, and an upper portion distal to the fins. Upper sidewall spacers are positioned between the upper portion of the sidewall insulators and the source/drain contacts, and the upper sidewall spacers are positioned on sidewalls of the gate contacts. The upper sidewall spacers are only adjacent to the upper portion of the sidewall insulators and are not adjacent to the lower portion of the sidewall insulators. The upper sidewall spacers can be a different insulator material from the sidewall insulators, and the two can have different dielectric constants.

Also, an inter-layer dielectric is positioned on the lower source/drain contacts and the upper portion of the sidewall insulators. Upper gate contacts extend through the inter-layer dielectric and contact the lower portion of the gate contacts, and upper source/drain contacts extend through the inter-layer dielectric and contact the lower source/drain contacts.

BRIEF DESCRIPTION OF THE DRAWINGS

The embodiments herein will be better understood from the following detailed description with reference to the drawings, which are not necessarily drawn to scale and in which:

FIG. 1A is a top (plan) view conceptual schematic diagram of an integrated circuit structure according to embodiments herein;

FIG. 1B is a cross-sectional view conceptual schematic diagram along line X1-X1 in FIG. 1A of an integrated circuit structure according to embodiments herein;

FIG. 1C is a cross-sectional view conceptual schematic diagram along line X2-X2 in FIG. 1A of an integrated circuit structure according to embodiments herein;

FIG. 1D is a cross-sectional view conceptual schematic diagram along line Y-Y in FIG. 1A of an integrated circuit structure according to embodiments herein;

FIGS. 2A-2D are conceptual schematic diagrams of manufacturing stages of integrated circuit structures corresponding the views shown in FIG. 1A-1D, respectively;

FIGS. 6A-6D are conceptual schematic diagrams of manufacturing stages of integrated circuit structures corresponding the views shown in FIG. 1A-1D, respectively;

FIGS. 10A-10D are conceptual schematic diagrams of manufacturing stages of integrated circuit structures corresponding the views shown in FIG. 1A-1D, respectively;

DETAILED DESCRIPTION

Figure 3A:
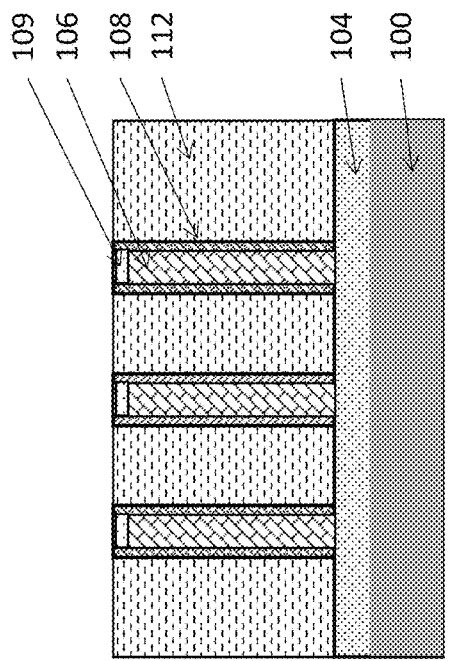
FIGS. 3A-3D are conceptual schematic diagrams of manufacturing stages of integrated circuit structures corresponding the views shown in FIG. 1A-1D, respectively.
Figure 3B:
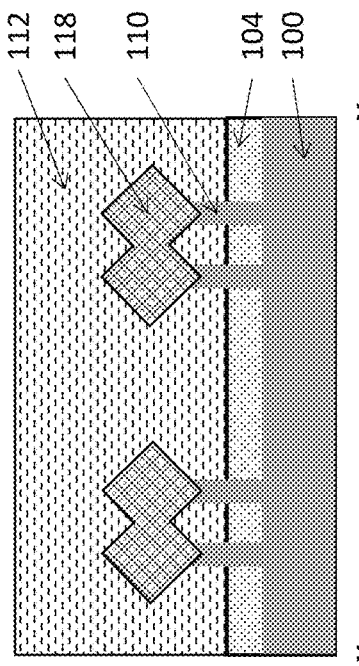
Figure 3C:
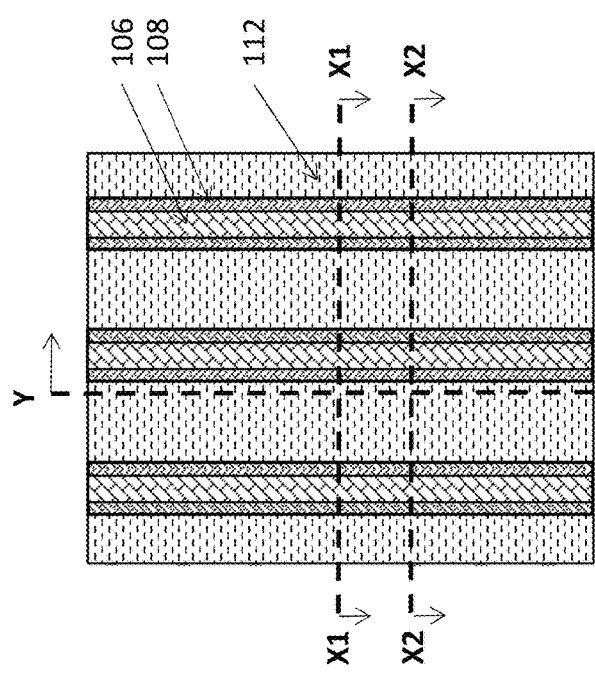
Figure 3D:
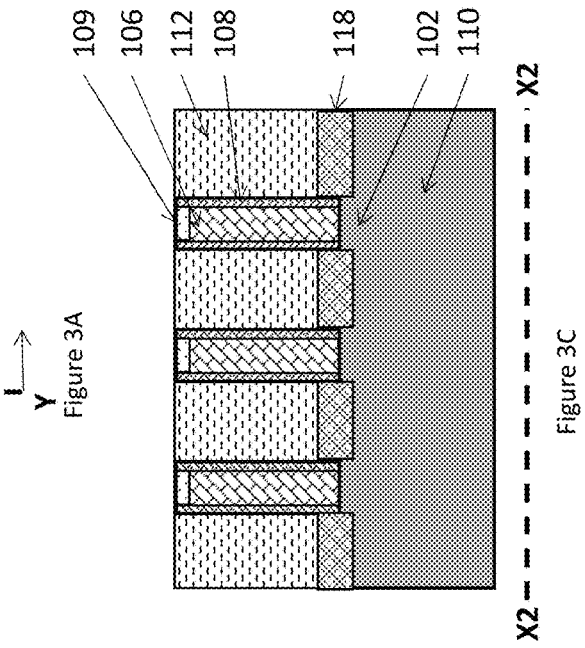
Figure 4A:
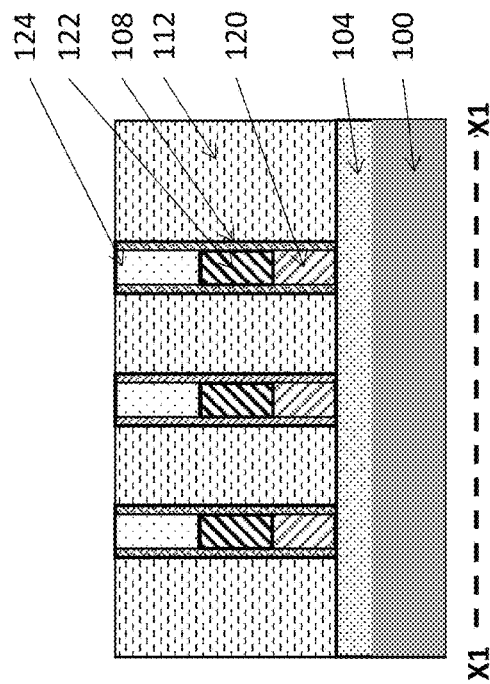
FIGS. 4A-4D are conceptual schematic diagrams of manufacturing stages of integrated circuit structures corresponding the views shown in FIG. 1A-1D, respectively.
Figure 4B:
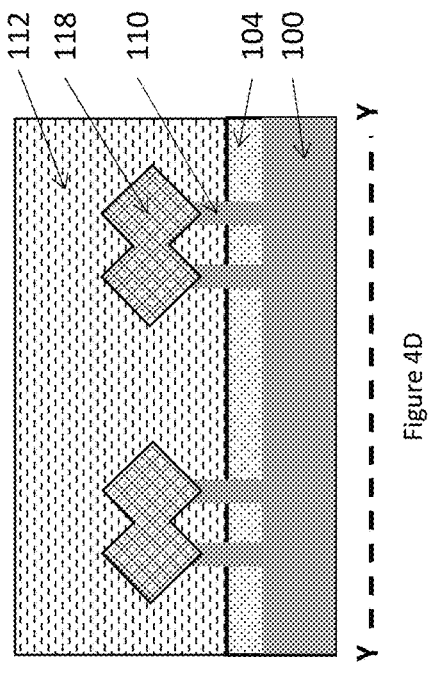
Figure 4C:
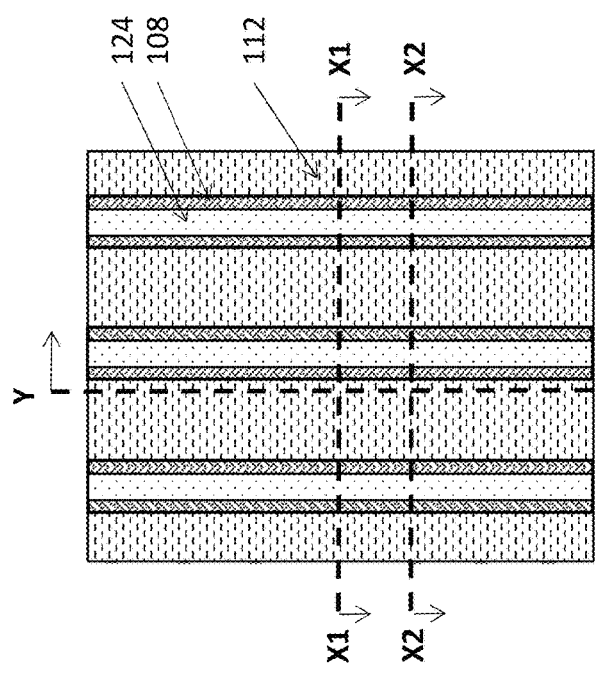
Figure 4D:
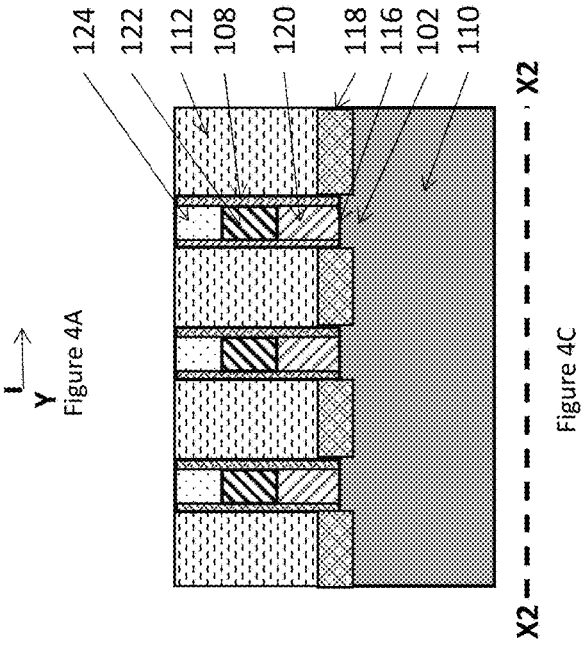
Figure 5A:
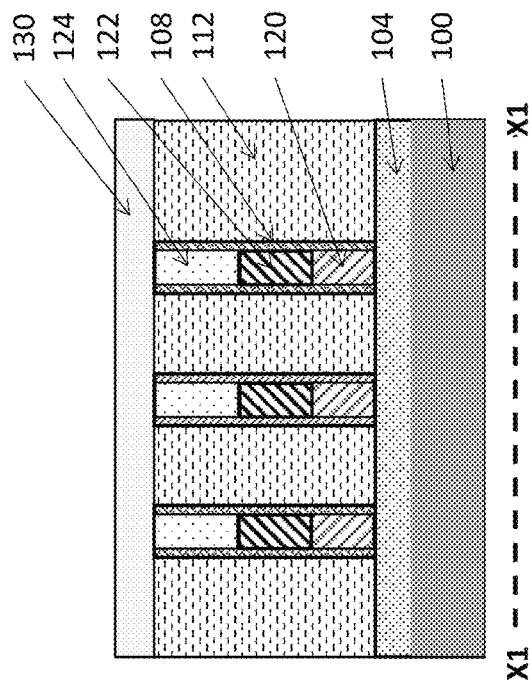
FIGS. 5A-5D are conceptual schematic diagrams of manufacturing stages of integrated circuit structures corresponding the views shown in FIG. 1A-1D, respectively.
Figure 5B:
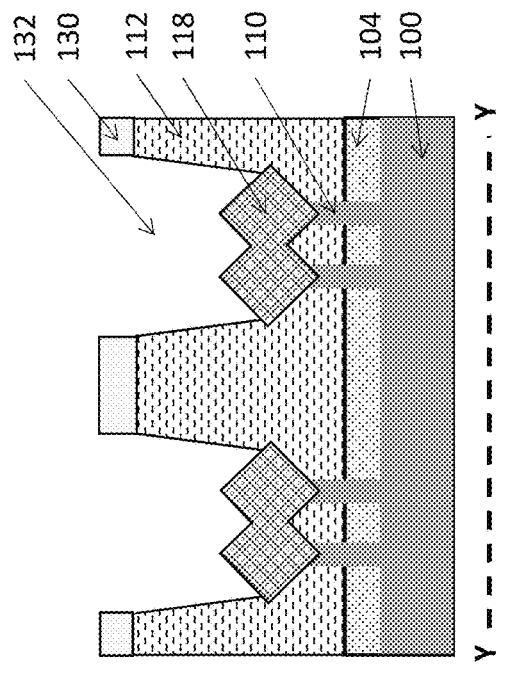
Figure 5C:
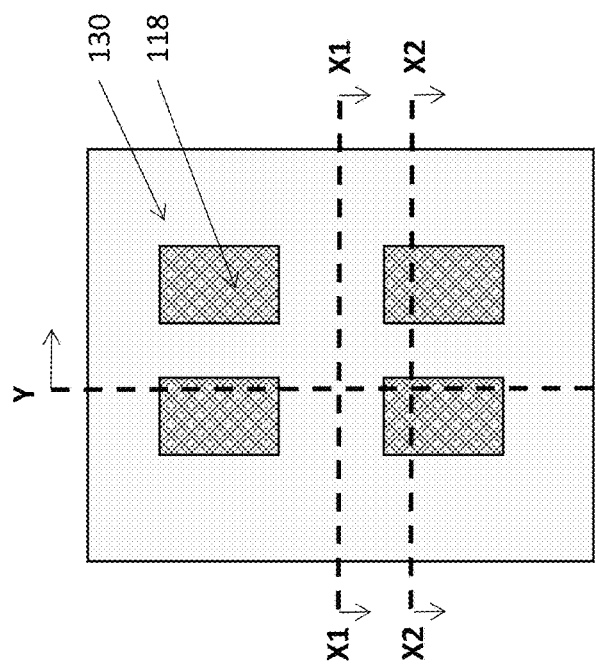
Figure 5D:
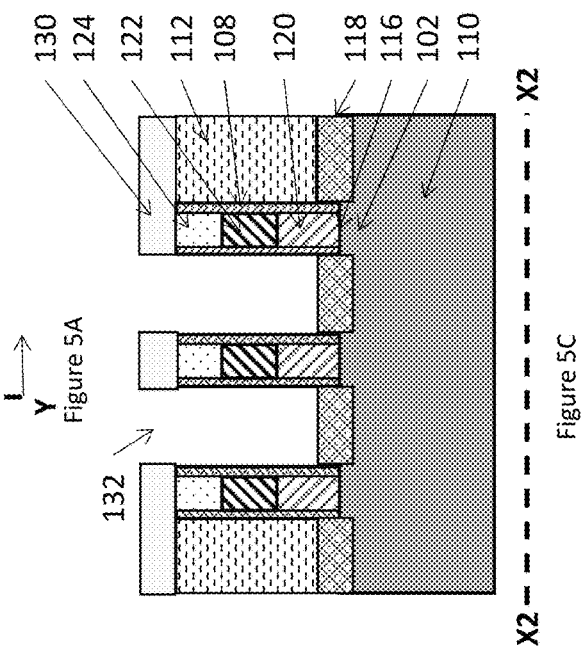
Figure 7B:
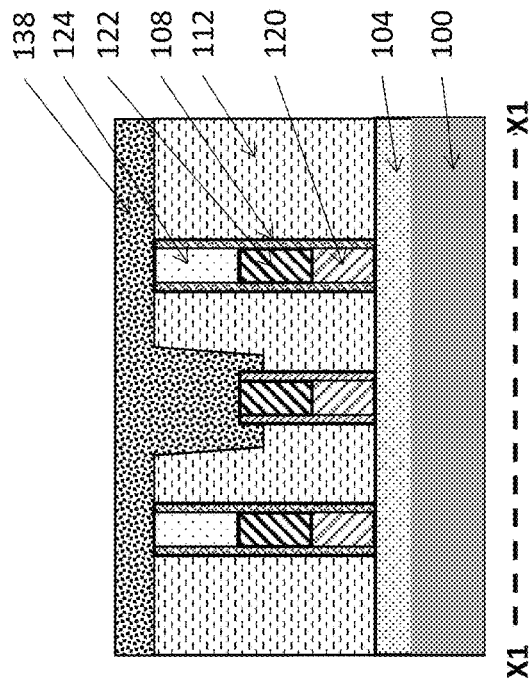
FIGS. 7A-7D are conceptual schematic diagrams of manufacturing stages of integrated circuit structures corresponding the views shown in FIG. 1A-1D, respectively.
Figure 7D:
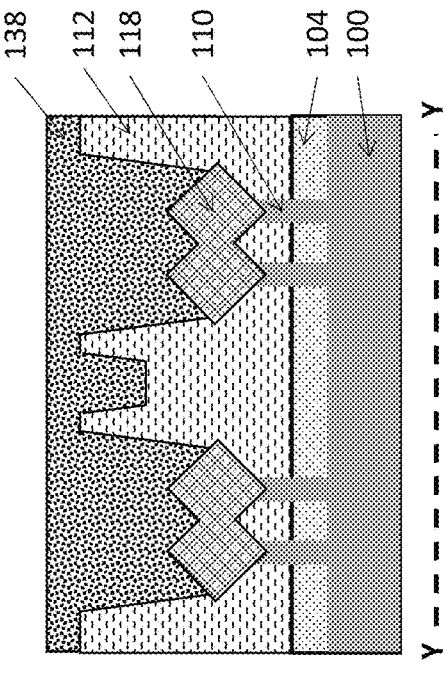
Figure 7A:
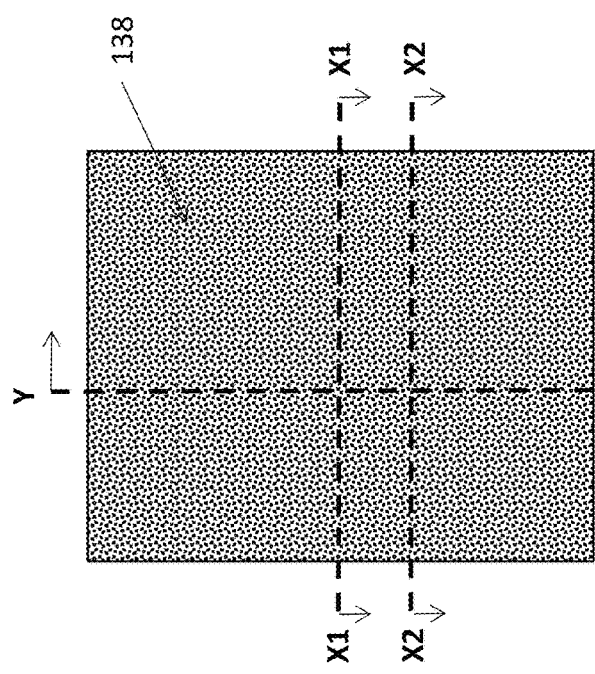
Figure 7C:
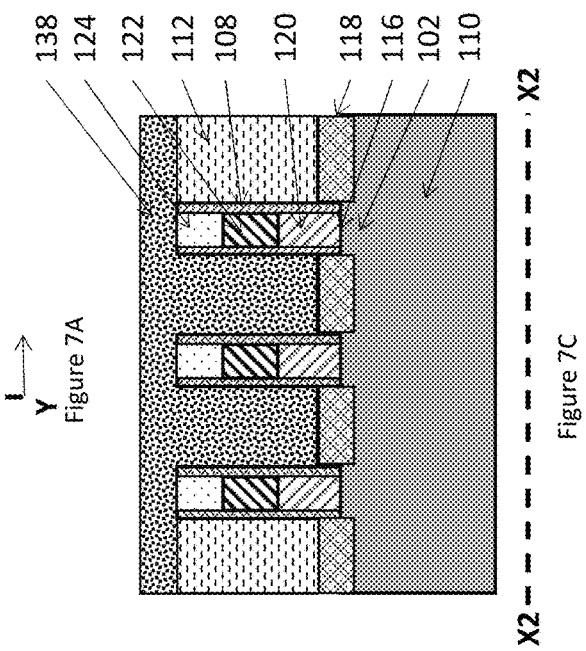
Figure 8A:
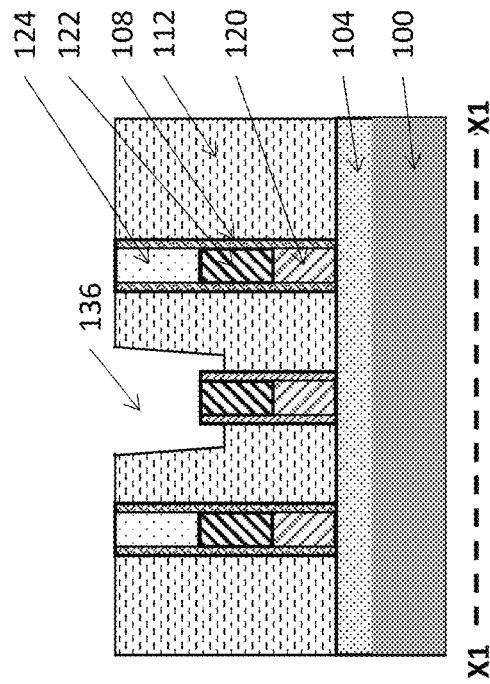
FIGS. 8A-8D are conceptual schematic diagrams of manufacturing stages of integrated circuit structures corresponding the views shown in FIG. 1A-1D, respectively.
Figure 8B:
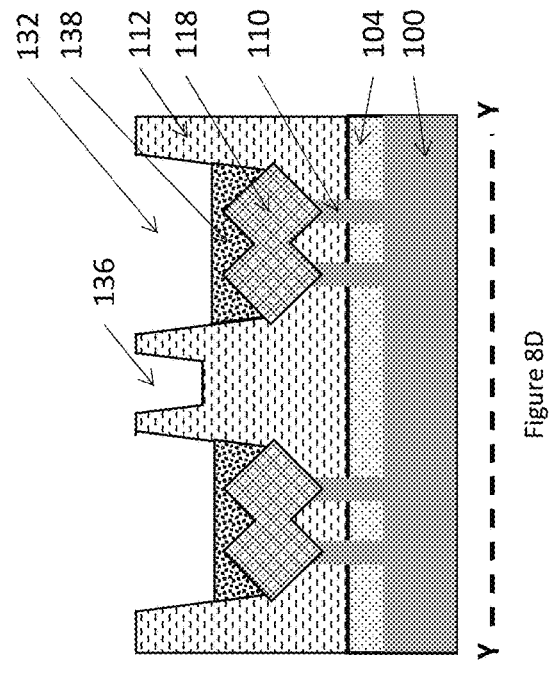
Figure 8C:
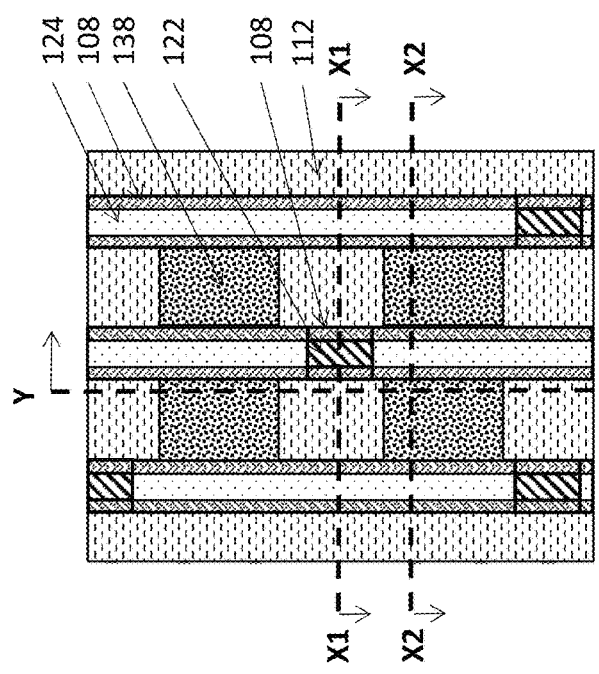
Figure 8D:
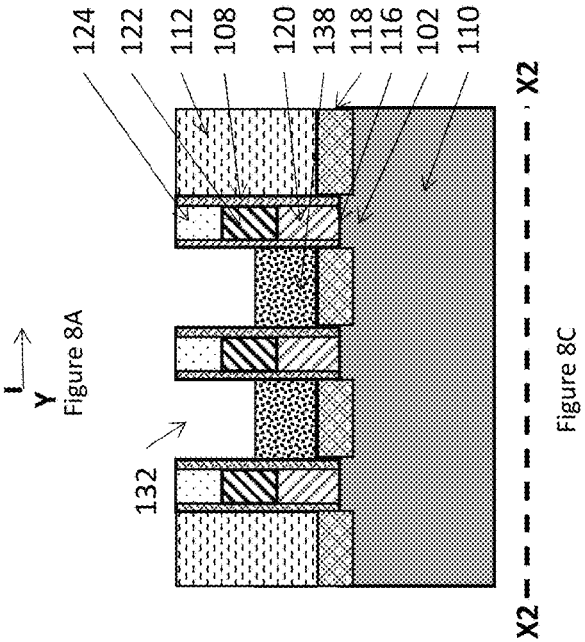
Figure 9A:
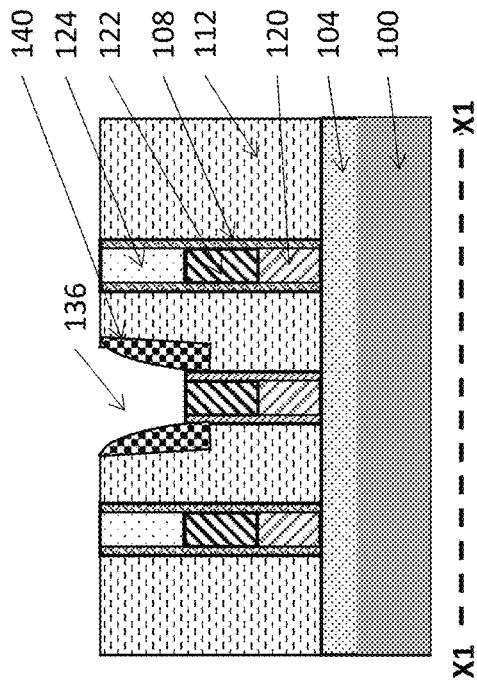
FIGS. 9A-9D are conceptual schematic diagrams of manufacturing stages of integrated circuit structures corresponding the views shown in FIG. 1A-1D, respectively.
Figure 9B:
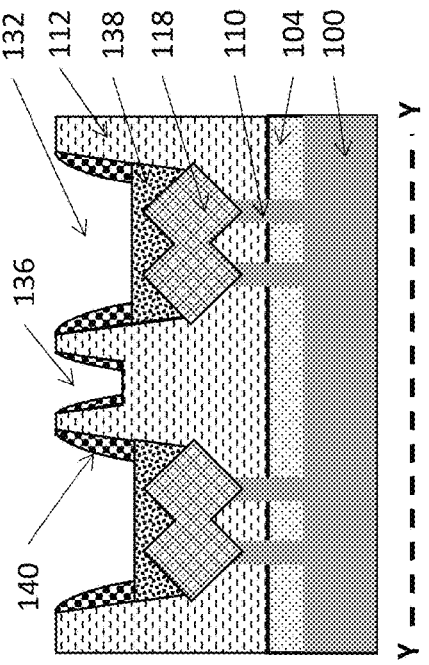
Figure 9C:
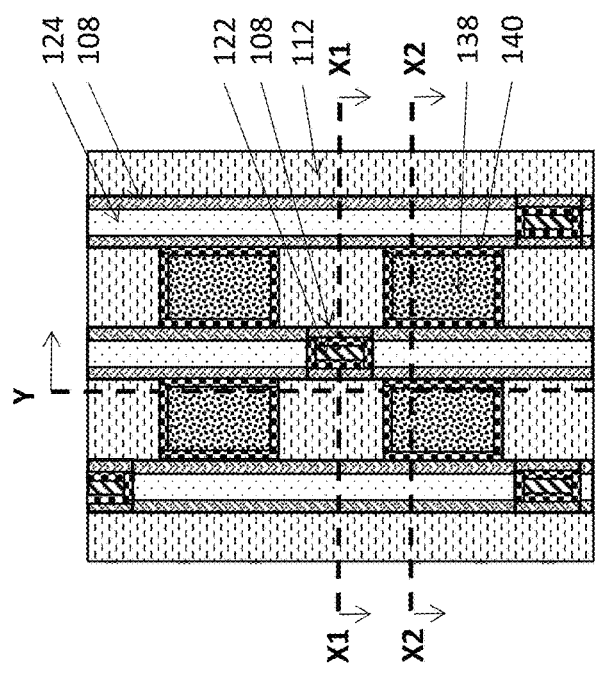
Figure 9D:
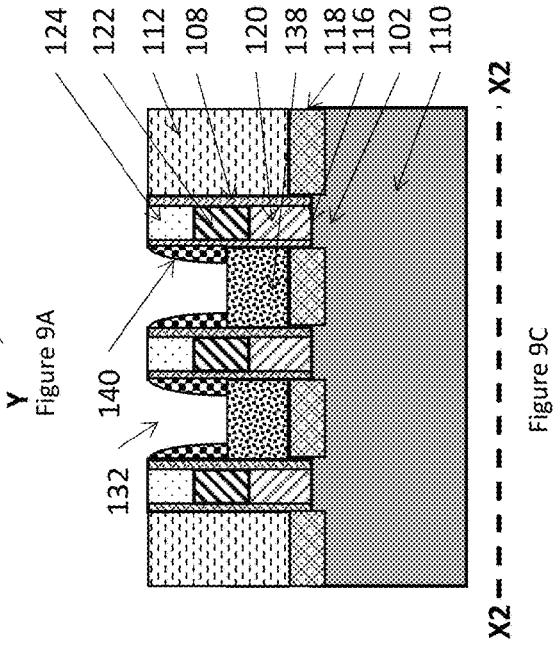
Figure 11A:
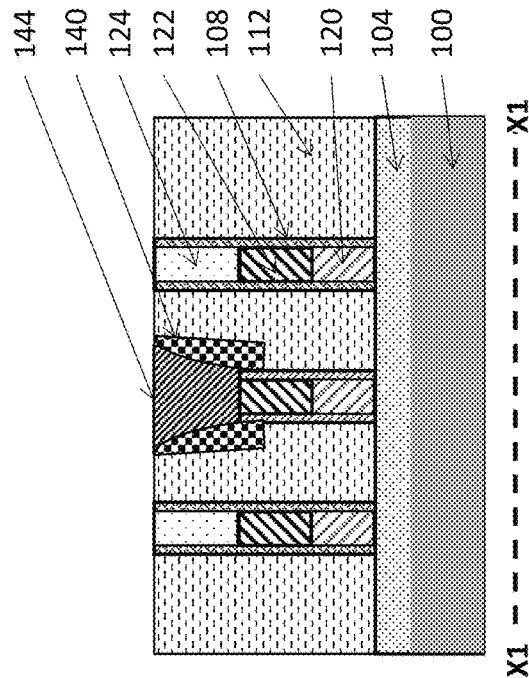
FIGS. 11A-11D are conceptual schematic diagrams of manufacturing stages of integrated circuit structures corresponding the views shown in FIG. 1A-1D, respectively.
Figure 11B:
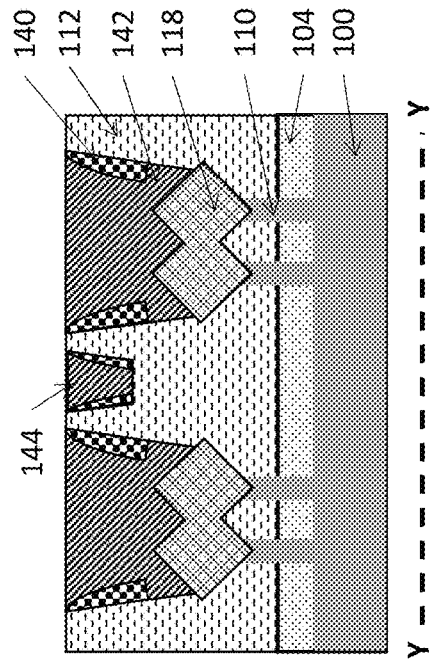
Figure 11C:
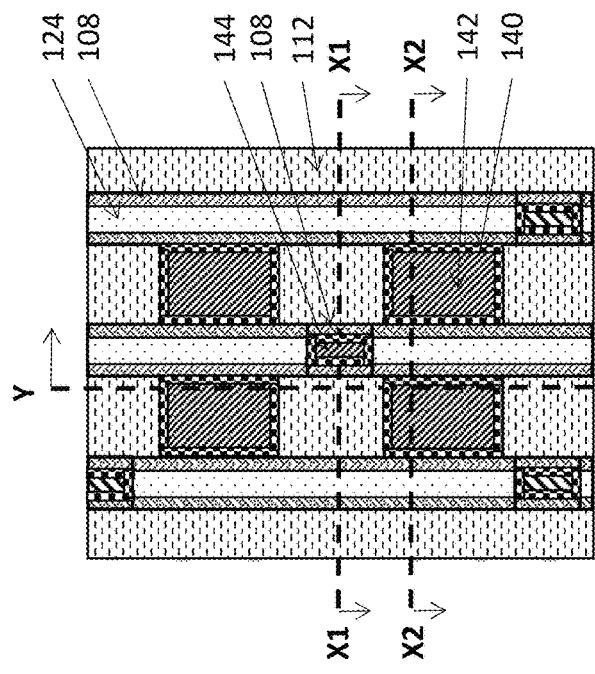
Figure 11D:
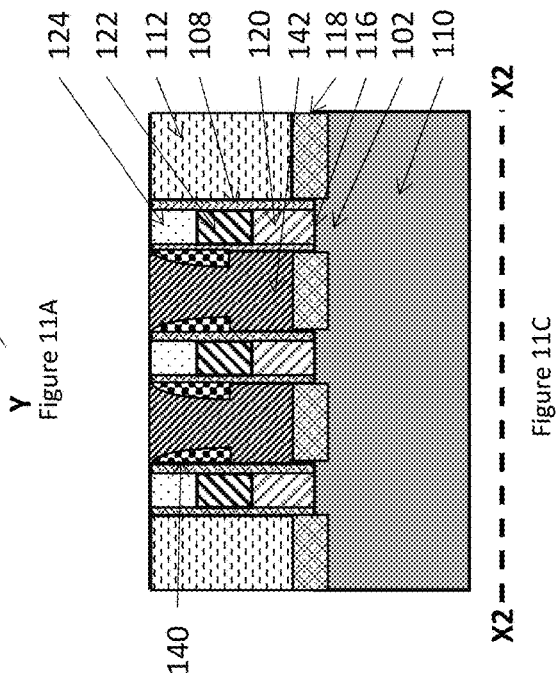

As noted above, sometimes the insulator between gates and source/drain contacts can be reduced or removed, allowing shorts (undesirable electrical connections) between the gates and the source/drain contacts. In addition, when forming upper contacts through inter-layer dielectrics (ILDs) to the lower contacts of the gates and source/drains, it can be difficult to properly align such contacts, which may also result in unintended/undesirable short circuits.

The processing described herein uses strategically placed and sized upper sidewall spacers to accommodate contact misalignment by providing additional spacing between gates and source/drain contacts, while at the same time not restricting space where the contacts electrically connect to the source/drain regions. Further, in order to combat the reduction of the insulator between gates and source/drain contacts, such an insulator can be enlarged or "topped-off"; however, such processing can affect the later-formed silicide contact area, so the methods and devices herein supplement the insulator with upper sidewall spacers, which avoids the need to top off such insulators.

More specifically, upper sidewall spacers disclosed herein are positioned to provide additional insulator width so as to reduce the chance of unintended electrical shorts caused by misalignment of conductive contact vias within an overlying inter-layer dielectric. Similarly, such additional insulator width provided by the upper sidewall spacers helps prevent electrical shorts between lower source/drain contacts and gate structures within the device layer itself. However, because the upper sidewall spacers are only formed along the upper portion of the gate's sidewall insulators, they do not interfere with the lower source/drain contacts making proper electrical connection to the source/drain structures (while full sidewall length spacers might cover the source/drain structures and prevent proper connection to the lower source/drain contacts). Similarly, because a gate contact recess is made wider than the space outside the gate's sidewall insulators, the corresponding upper sidewall spacers are only formed outside the width of the gate structures so that the upper sidewall spacers do not interfere with a lower gate contact making proper electrical connection with corresponding gate structures.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the somewhat conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally transistor structures can, in one example, be formed by depositing or implanting impurities into a substrate to form at least one semiconductor channel region, bordered by isolation regions. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. Isolation structures are generally formed using highly insulating material (this allows different active areas of the substrate to be electrically isolated from one another). Also, a hardmask or cap can be formed of any suitable material, whether now known or developed in the future, such as a nitride, metal, or organic hardmask, that has a hardness greater than the substrate and insulator materials used in the remainder of the structure.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed (grown or deposited) from any of the many candidate low dielectric constant materials (low-K (where K corresponds to the dielectric constant) materials such as fluorine or carbon-doped silicon dioxide, porous silicon dioxide, porous carbon-doped silicon dioxide, spin-on silicon or organic polymeric dielectrics, etc.) or high dielectric constant (high-K) materials, including but not limited to silicon nitride, silicon oxynitride, a gate dielectric stack of $SiO_2$ and $Si_3N_4$, hafnium oxide ($HfO_2$), hafnium zirconium oxide ($HfZrO_2$), zirconium dioxide ($ZrO_2$), hafnium silicon oxynitride (HfSiON), hafnium aluminum oxide compounds ($HfAlO_x$), other metal oxides like tantalum oxide, etc. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, polysilicon-germanium, rendered conductive by the presence of a suitable dopant, etc. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art. Further, some conductors herein can be partially or fully formed of a metal having a specific work function. The work function of the conductor can be selected to use a specific amount of energy to remove an electron from the solid material, and thereby enhance transistor performance.

FIGS. 1A-13 use an example that shows field effect transistors (FETs), and more specifically fin-type FETs (Fin-FETs). While only one type or a limited number of transistor types are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

FIGS. 1A-1D illustrate one example of a partially formed FinFET structure. More specifically, FIG. 1A is a top (plan) view conceptual schematic diagram of an integrated circuit structure according to embodiments herein, FIG. 1B is a cross-sectional view conceptual schematic diagram of the same along line X1-X1 in FIG. 1A, FIG. 1C is a cross-sectional view conceptual schematic diagram along line X2-X2 in FIG. 1A, and FIG. 1D is a cross-sectional view conceptual schematic diagram along line Y-Y in FIG. 1A.

To form the structures shown in FIGS. 1A-1D, different processing can be used. In some exemplary methods, a bottom layer 100 (of in situ formed, or later doped, semiconductor material) is patterned into fins 110 as shown in FIG. 1D. As shown in FIG. 1C, this forms a "first" layer or substrate structure (e.g., fins 110). Note that while the first layer can be a fin structure, it does not need to be, and the first layer can, in some implementations, simply be a planar layer. Therefore, the fins 110 are sometimes generically referred to herein simply as a layer or substrate. As can be seen in FIG. 1D, an insulator or isolation material 104 (e.g., shallow trench isolation STI) can be formed and reduced in height to reveal the fins 110.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

FIGS. 2A-2D show the same views as FIGS. 1A-1D mentioned above. As shown in FIGS. 2A-2D, such processing forms sacrificial gates 106 (which are commonly referred to as "dummy" gates) extending over the channel regions 102 of the fin layer 110 (e.g., see FIG. 2C) using mask 109; the sacrificial gates 106 can be, in one example, polysilicon. Also, sidewall insulators 108 or sidewall spacers (which can be, for example, a low-k material) are formed on the sacrificial gates 106. Such methods form source/drain structures 118 (using, for example, epitaxial growth or implantation processes) in and/or on the fin layer 110 on opposite sides of the sacrificial gates 106. The source/drain structures 118 are self-aligned in the epitaxial growth process by the sidewall insulators 108.

For purposes herein, "sidewall spacers" are structures are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material only along the vertical sidewalls of structures. This material left on the vertical sidewalls is referred to as sidewall spacers.

FIGS. 3A-3D show the same relative views as FIGS. 1A-1D mentioned above. As shown in FIGS. 3A-3D, these processes form a dielectric layer 112 (e.g., an oxide, such as silicon dioxide). The dielectric layer 112 therefore contacts the sidewall insulators 108 and is located between the sacrificial gates 106. All elements can be planarized to the same height as shown in FIGS. 3A-3D, using for example chemical-mechanical planarization (CMP) processes.

FIGS. 4A-4D show the same views as FIGS. 1A-1D mentioned above. In FIGS. 4A-4D, these methods remove the sacrificial gates 106 (but leave the sidewall insulators 108 and dielectric layer 112 in place) using selective material removal processing that only attacks the material of the sacrificial gates 106 (e.g., only attacks polysilicon) and leaves the other materials substantially unaffected.

Selective material removal processes first form elements from materials that can be selectively removed relative to one another; and then later apply removal techniques that remove one material, while leaving the other material(s) substantially unaffected. While some material selections and selective removal techniques are mentioned herein, those ordinarily skilled in the art would understand that different materials could be utilized, so long as such materials are selectively removable from one another. Note that while some selective material removal processes may partially remove (or produce rounding of) adjacent materials, such may not be fully shown in the drawings, to simplify the drawings and thereby more clearly illustrate the concepts herein.

As shown in FIGS. 4A-4D, with the sacrificial gates 106 removed, the methods herein form a gate insulator 116 (e.g., gate oxide) by depositing or growing an oxide on (directly contacting) the channel region 102 of the fin layer 110, if such was not previously formed. Then, conductive gate structures 120, 122, 124 are formed on the gate insulator by first forming a lower portion 120 of the gate structures as a work function metal (WFM, e.g., a high-k/metal gate (HKMG) etc.), such as p-type and n-type work function metals used in p-type and n-type transistors. For example, the WFM 120 can include deposition of multiple layers of different conductors in a specific combination in order to produce a desired work function. The WFM 120 is then potentially reduced in height to only remain in a lower portion of the recess between the sidewall insulators 108 adjacent the gate insulator 116. An upper conductor 122 which can be a single conductor (e.g., tungsten, etc.) or multiple conductors is formed (deposited, etc.), followed by an insulating/protective hardmask cap 124 (e.g., SiN, etc.). Afterward, a chemical mechanical planarization (CMP) process can form a flat top surface and to remove any excess materials.

FIGS. 5A-5D show the same views as FIGS. 1A-1D mentioned above. As shown in FIGS. 5A-5D, the methods herein pattern a first mask 130 and perform selective material removal (e.g., etching) to remove portions of the dielectric layer 112 that are above the source drain structures 118 to form source/drain contact recesses 132. This processing can also be directional (anisotropic) and remove materials that are on horizontal surfaces parallel to the top of the fin 110 and surface of the lower layer 100 (while leaving most of the sidewall insulator 108 on the vertical surfaces that are perpendicular to the horizontal surfaces), and this processing is selective so as to not remove the source/drain structures 118. Therefore, the processing shown in FIGS. 5A-5D exposes ones of the source/drain structures 118 (as permitted by the first mask 130) but avoids substantially removing the sidewall insulators 108 or the source/drain structures 118.

FIGS. 6A-6D show the same views as FIGS. 1A-1D mentioned above. As shown in FIGS. 6A-6D, the methods herein pattern a second mask 134 and perform selective material removal (e.g., etching, etc.) to remove selected ones of the caps 124 and to form gate contact recesses 136 in the dielectric layer 112. Such processing can involve multiple selective material removal steps through the mask 134. In addition, note that (as shown in FIG. 6B) the width of the gate contact recesses 136 are wider than (e.g., 25%, 50%, 100%, 200% etc. wider than) the width W between the outer surfaces (surfaces distal to the gate structure) of the sidewall insulators 108, and this allows the later formed upper sidewall spacers (discussed below) to not be formed on the top of the upper portion 122 of the gate structures.

Therefore, the processing shown in FIGS. 6A-6D exposes ones of the upper portions 122 of the gate structures (as permitted by the second mask 134). As shown in FIGS. 6A-6D, this process of removing selected ones of the caps 124 recesses the dielectric layer 112 below the top of the upper conductor 122 of the gate structure to cause a portion (e.g., one-third, one-half, etc.) of the upper conductor 122 and the corresponding sidewall insulators 108 to protrude and extend above the bottom of the gate contact recess 136 (again, in this disclosure, the "top" of an element is relatively more distal to the fins, while the "bottom" is relatively more adjacent to (closer to) the fins).

FIGS. 7A-7D show the same views as FIGS. 1A-1D mentioned above. As shown in FIGS. 7A-7D, the methods herein simultaneously fill the source/drain contact recesses 132 and the gate contact recesses 136 with a sacrificial material 138 (such as an optical polymerization layer (OPL), or other selectively removable material) using deposition processes, growth processes, etc., in a single, continuous processing step.

FIGS. 8A-8D show the same views as FIGS. 1A-1D mentioned above. As shown in FIGS. 8A-8D, the methods herein reduce the height of the sacrificial material 138 (to a "first" height from the (top of the) fins) in selective material removal processing (e.g., etching) that only attacks the sacrificial material 138 and leaves the other materials mentioned herein substantially unaffected. As shown in FIGS. 8A-8D, this processing only partially removes the sacrificial layer 138 from the source/drain contact recesses 132 (by limiting etching time/power) to leave only the upper portion (e.g., upper half, upper third) of the sidewall insulators 108 exposed. However, such processing removes all the sacrificial layer 138 from the gate contact recesses 136. Therefore, this processing reduces the height of the sacrificial layer 138 to a level below the bottom of the gate contact recesses 136, but still above the top of the source/drain structures 118. In other words, after the selective material removal process in FIGS. 8A-8D, the top (distal to the fin) of the sacrificial layer 138 has a height that is between the source/drain structures 118 and the gate contact recess 136.

FIGS. 9A-9D show the same views as FIGS. 1A-1D mentioned above. As shown in FIGS. 9A-9D, with the reduced-height sacrificial layer 138 in place only in the bottoms of the source/drain contact recesses 132, these methods form upper sidewall spacers 140 (e.g., a nitride such as silicon nitride). Sidewall spacer formation is discussed above, and with such processing the upper sidewall spacers 140 are simultaneously formed only on the exposed upper sidewall surfaces of the source/drain contact recesses 132 and full sidewalls of the gate contact recesses 136 (the sidewall portions not covered by the reduced-height sacrificial layer 138). This forms the upper sidewall spacers 140 only on the upper portion of the sidewall insulators 108 and on the sidewalls of the gate contact recesses 136 in the same processing operation.

In other words, as shown in FIGS. 9A-9D, in addition to the gate contact recesses 136, the upper sidewall spacers 140 are positioned only on the portions of the sidewall insulators 108 that contact the cap 124 and contact the upper portion (e.g., upper half, upper third) of the upper conductor 122 of the gate structure (and the upper sidewall spacers 140 are not positioned on the portions of the sidewall insulators 108 that contact the lower conductor 120 of the gate structure). The upper sidewall spacers 140 can be the same or a different insulator material from the sidewall insulators 108 (e.g., the two can have different dielectric constants) and the upper sidewall spacers 140 fill in any areas of the sidewall insulators 108 that have been rounded/reduced by previous processing herein. Again, note that because the width of the gate contact recesses 136 are wider than the width W (FIG. 6B) between the outer surfaces of the sidewall insulators 108, this allows the upper sidewall spacers 140 to not be formed on the top of the upper portion 122 of the gate structures.

FIGS. 10A-10D show the same views as FIGS. 1A-1D mentioned above. As shown in FIGS. 10A-10D, the methods herein remove the remaining portions of the sacrificial layer 138 in the same selective material removal process that leaves the other structures, such as the upper sidewall spacers 140 and dielectric layer 112, unaffected.

FIGS. 11A-11D show the same views as FIGS. 1A-1D mentioned above. As shown in FIGS. 11A-11D, the methods herein deposit one or more layers of conformal conductor to form a second conductor (142, 144) in the gate contact recesses 136 and the source/drain contact recesses 132 in a single continuous process. The processing shown in FIGS. 11A-11D therefore forms source/drain contacts 142 and gate contacts 144 through the dielectric layer 112 to the upper conductor 122, and simultaneously forms the source/drain structures 118 (using the same material in a single processing step). Note that, as shown in FIGS. 11A-11D, the upper sidewall spacers 140 narrow the upper portions of contacts 142 and 144 relative to their respective lower portions.

Figure 12B:
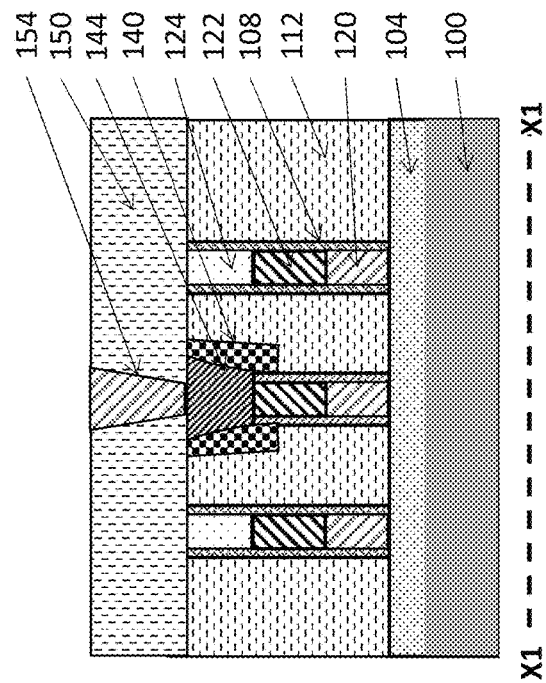
FIGS. 12A-12D are conceptual schematic diagrams of manufacturing stages of integrated circuit structures corresponding the views shown in FIG. 1A-1D, respectively.
Figure 12D:
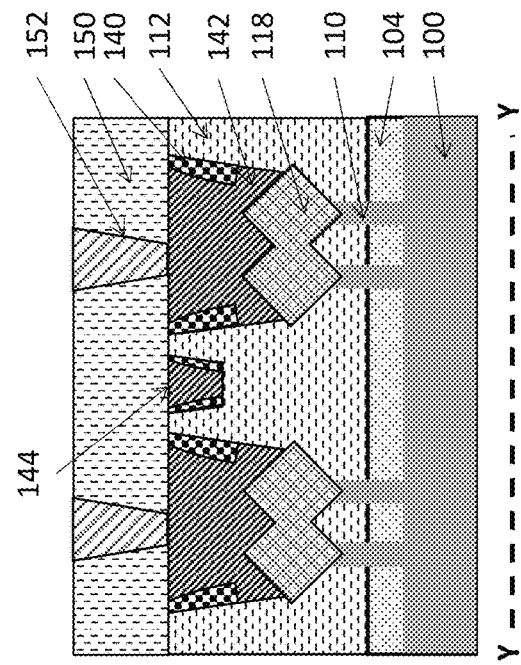
Figure 12A:
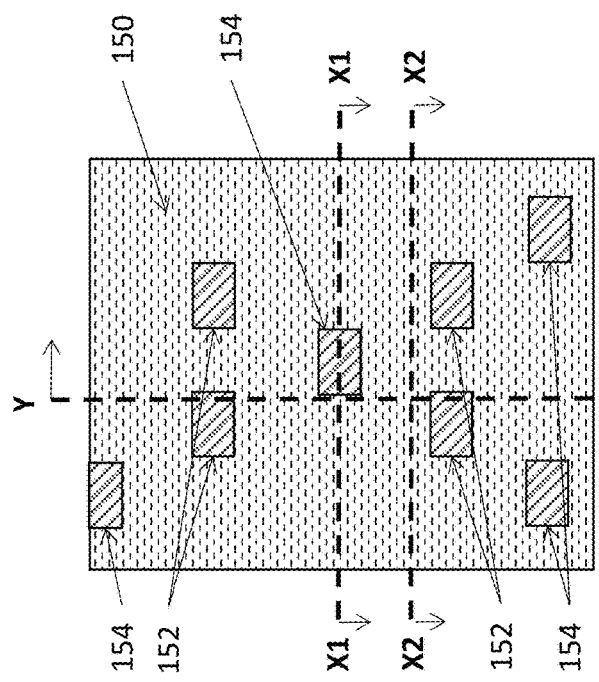
Figure 12C:
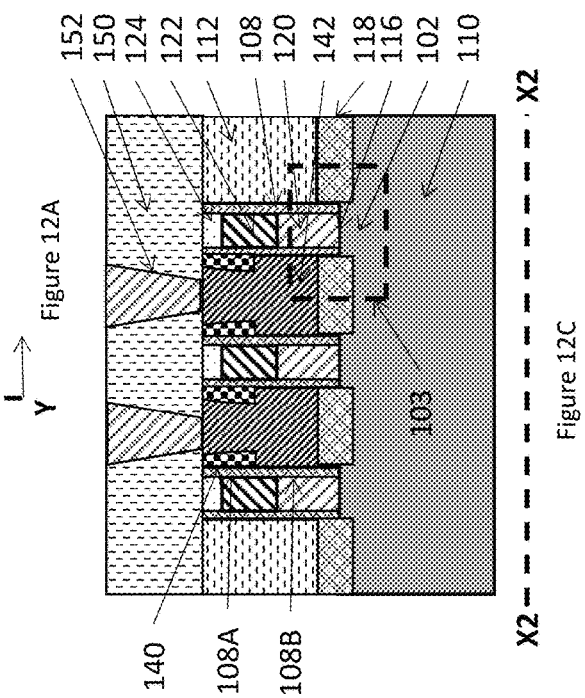

FIGS. 12A-12D show the same views as FIGS. 1A-1D mentioned above. As shown in FIGS. 12A-12D the top layers can be planarized/height reduced (e.g., using CMP, etc.), an interlayer dielectric (ILD) 150 is deposited or grown, and via openings are patterned through the ILD 150. Such via openings are subsequently filled with one or more conductors to create via contacts, including source/drain via contacts 152 (FIGS. 12A and 12B) and gate via contacts 154 (FIGS. 12A and 12C). Additional wiring layers can be formed over such ILD 150, as is understood by those ordinarily skilled in the art; however, such elements are not illustrated to avoid drawing clutter and maintain reader focus.

Also, FIGS. 12A-12D illustrate that this processing forms many fin-type field effect transistors (FinFETs) one of which is identified by box 103 that includes a channel region 102, source/drain regions 118 on the sides of the channel region 102, a gate oxide (insulator) 116, and a gate (conductor) 120, 122. As is explained above, voltage in the gate 120, 122 changes the conductivity of the channel 102 allowing or preventing current from flowing between the source/drains 118. With such processing multiple FinFETs 103 are formed on each fin 110 herein.

Therefore, FIGS. 12A-12D demonstrate that such processing produces exemplary structures that include (among other components) parallel fins 110 extending from a lower layer 100 that are patterned in a first direction, and parallel gate structures 120, 122 intersecting the fins 110 in a second direction perpendicular to the first direction. Here, both the first and second directions are parallel to the top surface of the fin 110 and lower layer 100 (e.g., see FIG. 1A). Again, in this disclosure, the "top" of an element is relatively more distal to the fins 110 and/or lower layer 100, while the "bottom" is more adjacent to (closer to) the fins 110 and/or lower layer 100. In other words "top" and "bottom" used herein correspond to the orientation of the drawings, and such terms are otherwise arbitrary.

Additionally, a gate insulator 116 is between the lower portion 120 of the gate structures and the (top of the) fins 110, and a lower gate contact 144 is positioned on the (top of the) upper portions 122 of the gate structures. Epitaxial source/drain structures 118 (structures having a crystalline orientation consistent with epitaxial growth processes) are positioned on the fins 110 between the gate structures 120, 122. Further, lower source/drain contacts 142 are on the source/drain structures 118. Such lower source/drain contacts 142 are also positioned between the gate structures 120, 122.

Sidewall insulators 108 are positioned between the gate structures 120, 122 and the lower source/drain contacts 142. The sidewall insulators 108 have a lower portion 108B (e.g., bottom half, bottom third, etc.; identified only in FIG. 12C to avoid drawing clutter) adjacent to the fins 110, and an upper portion 108A (e.g., top half, top third, etc.; and identified only in FIG. 12C to avoid drawing clutter)distal to the fins 110.

Upper sidewall spacers 140 are positioned between the upper portion 108A of the sidewall insulators 108 and the source/drain contacts 142, and are also positioned on the full length of the sidewalls of the lower gate contacts 144. With regard to the sidewall insulators, the upper sidewall spacers 140 are only adjacent to the upper portion 108A of the sidewall insulators 108 and are not adjacent to the lower portion 108B of the sidewall insulators 108. The upper sidewall spacers 140 can be a different insulator material from the sidewall insulators 108 and can have different dielectric constants.

Also, an inter-layer dielectric 150 is positioned on the planarized surface (resulting from the above-mentioned potential CMP processing) formed by the lower source/drain contacts 142, the lower gate contacts 144, remaining ones of the caps 124, the dielectric layer 112, the upper sidewall spacers 140, and the upper portion 108A of the sidewall insulators 108. Conductive upper gate contacts 154 extend through the inter-layer dielectric 150 and contact the lower gate contacts 144; and similarly, conductive upper source/drain contacts 152 extend through the inter-layer dielectric 150 and contact the lower source/drain contacts 142.

As shown in FIGS. 12B-12D, the upper sidewall spacers 140 provide additional insulator width (along (parallel to, co-planar with) the planarized surface below the inter-layer dielectric 150) that reduces the chance of unintended electrical shorts caused by misalignment of either of the upper contact 152, 154 (conductive vias of the inter-layer dielectric 150).

Similarly, as shown in FIG. 12C, such additional insulator width provided by the upper sidewall spacers 140 helps prevent electrical shorts between the source/drain contacts 142, 152 and the upper portion 122 of the gate structures. However, because the upper sidewall spacers 140 are only formed along the upper portion 108A of the sidewall insulators 108, and not the lower portion 108B, they do not interfere with the lower source/drain contact 142 making proper connection to the source/drain structures 118 (while full sidewall length spacers might cover the source/drain structures 118 and prevent proper connection to the lower source/drain contacts 142).

Also, because the gate contact recess 136 is made wider than the space outside the sidewall insulators 108, the corresponding upper sidewall spacers 140 are only formed outside the width W of the upper portion 122 of the gate structures (see FIGS. 6B, 9B) so that the upper sidewall spacers 140 do not interfere with the lower gate contact 144 making proper electrical connection with the upper portion 122 of the gate structures. In other words, by forming the contacts to have an inverted mushroom, inverted T, or bottle shape in cross-section, the chance of shorts is reduced without affecting the ability to form proper electrical connections.

Figure 13:
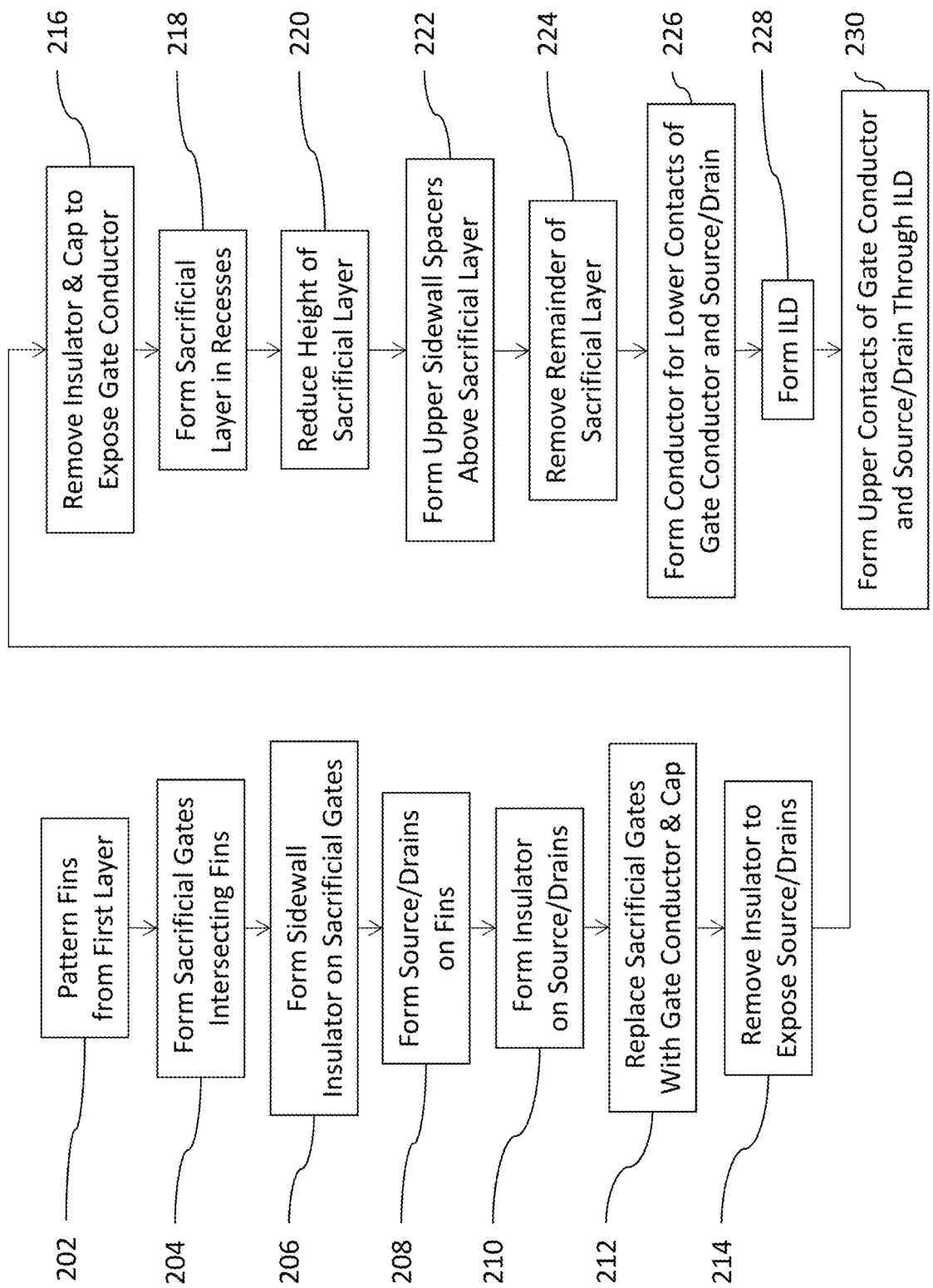
FIG. 13 is a flow diagram illustrating embodiments herein.

As shown in flowchart form in FIG. 13, exemplary methods herein pattern a layer to form parallel fins extending from the layer, where the fins are patterned in a first direction/orientation in item 202. Further, in item 204 such methods pattern parallel sacrificial gates intersecting the fins in a second direction perpendicular to the first direction. In item 206, these methods form a sidewall insulator on sidewalls of the sacrificial gates. The methods herein epitaxially grow source/drain structures on the fins between the sacrificial gates and sidewall insulators in item 208. In item 210, these methods form a dielectric layer on the source/drain structures and then optionally planarize the structure.

As shown in item 212, such methods replace the sacrificial gates with conductive gate structures, in processing that optionally forms the lower portion of gate structures to have a specific work function, forms the upper portion of the gate structures of a different conductor, and forms a cap over the upper portion. Additionally, as shown in item 214, these methods pattern the dielectric layer to expose the source/drain structures and the sidewall insulators, and this forms source/drain contact recesses, using selective material removal processing. Using similar processing, in item 216, such methods remove selected ones of the caps to expose the first conductor and this forms gate contact recesses in the dielectric layer. This process of removing selected ones of the caps (216) recesses the dielectric layer below the top of the first conductor to cause a portion of the first conductor and the sidewall insulators to protrude and extend above the bottom of the gate contact recess.

As shown in item 218, these methods simultaneously form a sacrificial layer in the source/drain contact recesses and in the gate contact recesses. Then, in item 220 such processing reduces the height of the sacrificial layer in order to leave an upper portion of the sidewall insulators exposed and to remove all the sacrificial layer from the gate contact recesses.

In item 222, with the reduced-height sacrificial layer in place, these methods form upper sidewall spacers on the sidewall surfaces not covered by the reduced-height sacrificial layer. This forms the upper sidewall spacers on the upper portion of the sidewall insulators and on the sidewalls of the gate contact recesses in the same processing operation in item 222. The upper sidewall spacers formed in item 222 can be a different insulator material from the sidewall insulators (e.g., the two can have different dielectric constants).

In item 224, the remaining portions of the sacrificial layer are then removed using selective material removal techniques; and in item 226, a second conductor is simultaneously formed in the gate contact recesses and the source/drain contact recesses. This processing in item 226 forms the lower source/drain and gate contacts through the dielectric layer to the gate structures and the source/drain structures (in a single continuous processing step). The structure can then be planarized to remove any excess conductor in item 226.

Also, as shown in item 228, an inter-layer dielectric is formed on the planarized surface (e.g., on the lower source/drain contacts, the lower gate contacts, remaining ones of the caps, the dielectric layer, the upper sidewall spacers, and the upper portion of the sidewall insulators, etc.). Contacts are formed through the ILD in item 230 where gate contacts extend through the inter-layer dielectric and contact the upper portion of the gate structures, and upper source/drain contacts extend through the inter-layer dielectric and contact the lower source/drain contacts.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An integrated circuit apparatus comprising:
   parallel fins extending from a layer, wherein the fins are patterned in a first direction;
   parallel gate structures intersecting the fins in a second direction perpendicular to the first direction;
   source/drain structures positioned on the fins between the gate structures;
   source/drain contacts positioned on the source/drain structures;
   sidewall insulators positioned on and between the gate structures and the source/drain contacts, wherein the sidewall insulators have a lower portion adjacent to the fins and an upper portion distal to the fins; and
   upper sidewall spacers positioned on and between the upper portion of the sidewall insulators and the source/drain contacts,
   wherein the upper sidewall spacers contact the upper portion of the sidewall insulators only, and are not adjacent the lower portion of the sidewall insulators, and
   wherein only the lower portion of the sidewall insulators contacts the source/drain contacts.

2. The integrated circuit apparatus according to claim 1, wherein the source/drain structures extend a first height from the fins, and wherein the upper sidewall spacers are positioned, on the sidewall insulators, more than the first height from the fins.

3. The integrated circuit apparatus according to claim 1, wherein the upper sidewall spacers provide additional insulator width to narrow upper portions of the source/drain contacts relative to lower portions of the source/drain contacts.

4. The integrated circuit apparatus according to claim 1, wherein the upper sidewall spacers are a different insulator material from the sidewall insulators.

5. The integrated circuit apparatus according to claim 1, wherein the sidewall insulators and the upper sidewall spacers have different dielectric constants.

6. The integrated circuit apparatus according to claim 1, wherein the source/drain contacts and an upper portion of the gate structures are the same material.

7. The integrated circuit apparatus according to claim 1, further comprising gate contacts positioned on the gate structures, wherein the upper sidewall spacers are positioned on a full length of sidewalls of the gate contacts.

8. An integrated circuit apparatus comprising:
   parallel fins extending from a layer, wherein the fins are patterned in a first direction;
   parallel gate structures intersecting the fins in a second direction perpendicular to the first direction;
   gate contacts positioned on the gate structures;
   source/drain structures positioned on the fins between the gate structures;
   source/drain contacts positioned on the source/drain structures;
   sidewall insulators positioned on and between the gate structures and the source/drain contacts, wherein the sidewall insulators have a lower portion adjacent to the fins and an upper portion distal to the fins; and
   upper sidewall spacers positioned on and between the upper portion of the sidewall insulators and the source/drain contacts and positioned on sidewalls of the gate contacts,
   wherein the upper sidewall spacers contact the upper portion of the sidewall insulators only, and are not adjacent the lower portion of the sidewall insulators, and
   wherein only the lower portion of the sidewall insulators contacts the source/drain contacts.

9. The integrated circuit apparatus according to claim 8, wherein the source/drain structures extend a first height from the fins, and wherein the upper sidewall spacers are positioned, on the sidewall insulators, more than the first height from the fins.

10. The integrated circuit apparatus according to claim 8, wherein the upper sidewall spacers provide additional insulator width to narrow upper portions of the source/drain contacts relative to lower portions of the source/drain contacts.

11. The integrated circuit apparatus according to claim 8, wherein the upper sidewall spacers are a different insulator material from the sidewall insulators.

12. The integrated circuit apparatus according to claim 8, wherein the sidewall insulators and the upper sidewall spacers have different dielectric constants.

13. The integrated circuit apparatus according to claim 8, wherein the source/drain contacts and the upper portion of the gate structures are the same material.

14. The integrated circuit apparatus according to claim 8, wherein the upper sidewall spacers are positioned on a full length of the sidewalls of the gate contacts.

15. An integrated circuit apparatus comprising:
   fins extending from a layer;
   gate structures intersecting the fins;
   source/drain structures positioned on the fins between the gate structures;
   source/drain contacts positioned on the source/drain structures;
   sidewall insulators positioned on and between the gate structures and the source/drain contacts, wherein the sidewall insulators have a lower portion and an upper portion; and
   upper sidewall spacers positioned on and between the upper portion of the sidewall insulators and the source/drain contacts,
   wherein the upper sidewall spacers contact the upper portion of the sidewall insulators only, and are not adjacent the lower portion of the sidewall insulators, and
   wherein only the lower portion of the sidewall insulators contacts the source/drain contacts.

16. The integrated circuit apparatus according to claim 15, wherein the source/drain structures extend a first height from the fins, and wherein the upper sidewall spacers are positioned, on the sidewall insulators, more than the first height from the fins.

17. The integrated circuit apparatus according to claim 15, wherein the upper sidewall spacers provide additional insulator width to narrow upper portions of the source/drain contacts relative to lower portions of the source/drain contacts.

18. The integrated circuit apparatus according to claim 15, wherein the upper sidewall spacers are a different insulator material from the sidewall insulators.

19. The integrated circuit apparatus according to claim 15, wherein the sidewall insulators and the upper sidewall spacers have different dielectric constants.

20. The integrated circuit apparatus according to claim 15, wherein the source/drain contacts and an upper portion of the gate structures are the same material.

* * * * *